United States Patent
Widmann et al.

[11] Patent Number: 5,989,972
[45] Date of Patent: *Nov. 23, 1999

[54] CAPACITOR IN A SEMICONDUCTOR CONFIGURATION AND PROCESS FOR ITS PRODUCTION

[75] Inventors: Dietrich Widmann; Hanno Melzner; Wolfgang Hoenlein, all of Unterhaching, Germany

[73] Assignee: Siemens Aktiengesellschaft, Munich, Germany

[ * ] Notice: This patent issued on a continued prosecution application filed under 37 CFR 1.53(d), and is subject to the twenty year patent term provisions of 35 U.S.C. 154(a)(2).

[21] Appl. No.: 08/685,847

[22] Filed: Jul. 24, 1996

[30] Foreign Application Priority Data

Jul. 24, 1995 [DE] Germany ............... 195 27 023

[51] Int. Cl.$^6$ .................................................. H01L 21/70
[52] U.S. Cl. ........................................... 438/397; 438/738
[58] Field of Search ..................... 257/296, 300, 257/306, 307, 308, 309, 756; 438/396, 397

[56] References Cited

U.S. PATENT DOCUMENTS

| | | | |
|---|---|---|---|
| 5,084,405 | 1/1992 | Fazan et al. .................. | 257/306 |
| 5,126,280 | 6/1992 | Chan et al. .................. | 257/309 |
| 5,126,810 | 6/1992 | Gotou .......................... | 257/306 |
| 5,150,276 | 9/1992 | Gonzalez et al. ........... | 257/296 |
| 5,153,813 | 10/1992 | Oehrlein et al. ............ | 257/309 |
| 5,155,657 | 10/1992 | Oehrlein et al. ............ | 257/307 |
| 5,160,987 | 11/1992 | Pricer et al. ................ | 257/307 |
| 5,206,787 | 4/1993 | Fujioka ....................... | 257/307 |
| 5,214,296 | 5/1993 | Nakata et al. ............... | 257/308 |
| 5,240,871 | 8/1993 | Doan et al. .................. | 438/397 |
| 5,412,237 | 5/1995 | Komori et al. .............. | 257/756 |

FOREIGN PATENT DOCUMENTS

| | | |
|---|---|---|
| 0 295 709 A2 | 12/1988 | European Pat. Off. . |
| 0 415 530 A1 | 3/1991 | European Pat. Off. . |
| 0 484 088 A1 | 5/1992 | European Pat. Off. . |
| 0 513 988 A1 | 11/1992 | European Pat. Off. . |
| 43 01 690 A1 | 7/1993 | Germany . |
| 43 07 575 A1 | 9/1993 | Germany . |
| 2 285 338 | 7/1995 | United Kingdom . |

OTHER PUBLICATIONS

"Anisotropic Etching of Crystalline Silicon in Alkaline Solutions" (Seidel et al.), J. Electrochem. Soc., vol. 137, No. 11, Nov. 1990, pp. 3626–3632.

"Stacked Capacitor DRAM Cell with Vertical FINS (VF–STC)", Technical Disclosure Bulletin, vol. 33, No. 2, Jul. 1990, pp. 245–247.

Patent Abstracts of Japan No. 60009154 (Masahiro et al.), dated Jan. 18, 1985.

*Primary Examiner*—Wael M. Fahmy
*Assistant Examiner*—William David Coleman
*Attorney, Agent, or Firm*—Herbert L. Lerner; Laurence A. Greenberg

[57] ABSTRACT

A capacitor in a semiconductor configuration, especially a DRAM, includes an electrode structure having a plurality of spaced-apart elements being electrically connected with a connecting structure and all including p-conductive material with a doping $>10^{10}$ cm$^{-3}$. The elements of the electrode structure are either stacked or disposed side by side and may be cup-shaped. In a production process, a layer sequence of alternatingly one p$^-$-doped and one p$^+$-doped layer is produced, which receives an opening through the use of anisotropic etching. At least in a peripheral region of the opening, a p$^+$-zone is created, which connects the layer sequence and forms the connecting structure. Next, the p$^-$-doped layers are etched selectively to the p$^+$-doped layers, a capacitor dielectric is deposited, and a counterelectrode is produced.

21 Claims, 4 Drawing Sheets

CAPACITOR IN A SEMICONDUCTOR CONFIGURATION AND PROCESS FOR ITS PRODUCTION

BACKGROUND OF THE INVENTION

FIELD OF THE INVENTION

The invention relates to a capacitor in a semiconductor configuration, in particular a DRAM configuration, having an electrode structure which contains a plurality of spaced-apart elements that are electrically connected to one another by a connecting structure, a capacitor dielectric, and a counterelectrode. The invention also relates to a process for producing a capacitor in a semiconductor configuration.

A multiplicity of integrated circuits require capacitors. Examples, besides the typical one of a dynamic memory cell, are analog/digital or digital/analog converters and filter circuits. Provisions are needed for reducing the intrinsically great amount of space that a capacitor requires, particularly with the miniaturization of structures involved in the increased scale of integration or since chip area has to be economized upon. A typical example may be considered to be the dynamic semiconductor memory, in which the required area of the usually used single-transistor memory cell is reduced from one memory generation to another with increasing memory density. At the same time, the minimum capacitance of the memory capacitor must be preserved.

In dynamic semiconductor configurations, a single-transistor memory cell includes a readout transistor and a capacitor. By triggering the readout transistor through a word line, the information, that is the electric charge, stored in the capacitor can be read out through a bit line. The memory capacitor must have a minimum capacitance in order to provide reliable storage of the charge and simultaneous capability of distinguishing the read-out information. The lower limit for the capacitance of the memory capacitor is currently considered to be 20 fF. In order to attain that capacitor capacitance, the thickness of the dielectric must be as small as possible and the area of the capacitor as large as possible.

While up to the 1 Mbit memory generation, it has been possible to realize both the readout transistor and the capacitor in the form of planar components, from the 4 Mbit memory generation on configurations are known in which the capacitor is disposed in a trench (trench capacitor). The electrodes of the capacitor are disposed along the surface of the trench. Overall, that yields an effective surface area of the capacitor which is increased as compared with a planar configuration on the surface of the substrate.

A further option for increasing the capacitance with an unchanged changed or reduced space requirement for the capacitor is to construct the capacitor as a stacked capacitor. Through the word lines, a polysilicon structure, for instance a crown structure or a cylinder, is formed that is contacted with the substrate. The polysilicon structure forms a memory node that is provided with the capacitor dielectric and the capacitor plate or so-called cell plate. That concept has the advantage of being compatible with a logic process.

The free space above the substrate surface is used for the capacitor. The entire cell surface can be covered with the polysilicon structure, as long as the structures of adjacent memory cells are isolated from one another. Known configurations along those lines are the fin stacked capacitor and the crown stacked capacitor.

A semiconductor memory configuration with a stacked capacitor as the memory capacitor is known from Published European Patent Application 0 415 530 A1. The stacked capacitor includes a polysilicon structure with a plurality of polysilicon layers, stacked substantially parallel to each other and joined together through at least one lateral support. The lateral support is produced with the aid of a polysilicon layer that is subsequently etched back, so that a substantially upright land remains that joins the polysilicon layers which are stacked one above the other. The structure is formed by alternatingly depositing polysilicon layers and silicon oxide layers, which are etchable selectively to them, on the surface of the substrate, by structuring those layers, by producing the lateral supports on at least one side of the structure, and by selective etching out of the silicon oxide layers. The polysilicon structures are arsenic-doped. Next, silicon oxide is formed by thermal oxidation as the capacitor dielectric, over which the cell plate of doped polysilicon is deposited. In a capacitor with stacked electrode layers which is known from U.S. Pat. No. 5,240,871, variously rapidly etching isolation layers are applied over a polysilicon layer. The isolation layers are then structured and etched, producing a support framework. Subsequently, doped polysilicon is deposited and then a silicon nitride layer, followed by the formation of the cell plate.

SUMMARY OF THE INVENTION

It is accordingly an object of the invention to provide a capacitor in a semiconductor memory configuration and a process for its production, which overcome the hereinafore-mentioned disadvantages of the heretofore-known devices and methods of this general type and which have reduced process expenditure and space consumption enabling a high packing density.

With the foregoing and other objects in view there is provided, in accordance with the invention, a capacitor in a semiconductor configuration, in particular a DRAM configuration, comprising an electrode structure containing a plurality of spaced-apart elements and a connecting structure electrically connecting the elements to one another, the connecting structure and the elements of the electrode structure all being formed of p-conductive material with a dopant concentration of at least $10^{20}$ cm$^{-3}$; a capacitor dielectric; and a counterelectrode.

It is a definitive advantage of the invention that the thickness of the capacitor is less with a horizontal configuration, and the width of the capacitor is less in a vertical configuration, than in the known capacitors. In particular, the capacitor can be used in DRAM semiconductor configurations, since for the requisite minimum cell capacitance of 20 fF it is slight in thickness and occupies only a slight amount of surface area. It can be estimated that with such a capacitor the memory capacities of future generations of DRAMs, which make even more stringent demands in terms of their space requirement, will be realized. All that is needed for this purpose is to increase the number of layers and reduce the area of one layer. It is also possible to reduce the thickness or width of the capacitor by reducing the layer thickness and the dielectric thickness. The capacitor additionally has the advantage of enabling its electrode structure, in p-channel transistors, to be joined directly to the drain of the transistor with the aid of a contact hole. However, other ways of contacting the electrode structure with other circuit elements are also possible. For instance, in an n-channel selection transistor, contacting of the electrode structure to the drain of the transistor can be carried out through an intermediate metal layer, for instance of tantalum, titanium or titanium nitride, or a silicide layer or a filling of contact of holes, for instance with tungsten.

With the objects of the invention in view there is also provided a process for producing a capacitor in a semiconductor configuration, which comprises producing a base layer including a highly-doped p-conductive layer, on a surface of a substrate configuration; applying a layer sequence of one low-doped and one highly-doped p-conductive alternatingly layer, on a surface of the highly-doped p-conductive layer; structuring the layer sequence by an anisotropic etching, forming at least one opening extending as far as the base layer; producing a highly-doped p-conductive zone joining the layer sequence, at least in a peripheral region of the opening; selectively etching the low-doped p-conductive layers of the layer sequence to the highly-doped p-conductive layer sequence; conformally depositing a capacitor dielectric; and conformally depositing a conductive layer over the capacitor dielectric.

The process of the invention has the substantial advantage over known methods of requiring fewer process steps, without having to make sacrifices in other respects.

The capacitor in the semiconductor configuration has an electrode structure that includes a plurality of spaced-apart elements, which are electrically connected to one another by a connecting structure. The elements of the electrode structure and the associated connecting structure are all of p–doped material with a doping $>10^{20}$ cm$^{-3}$.

In accordance with another feature of the invention, the elements of the electrode structure are disposed generally flatly in stacked fashion or side by side.

In accordance with a further feature of the invention, the connecting structure extends, on at least one edge, in a direction crosswise to the surface of the elements.

In accordance with an added feature of the invention, the elements of the electrode structure may be cup-shaped and interested in one another.

In accordance with an additional feature of the invention, the connecting structure is joined inside the cup-shaped region to a substrate of the capacitor configuration and to the bottom part or bottom parts of the elements.

In accordance with yet another feature of the invention, the connecting structure is constructed as a rodlike support elements, centrally inside the cup-shaped electrode structure.

In the process for producing a capacitor, on a surface of a substrate configuration, first a base layer is produced that includes a p$^+$ layer, over which a layer sequence including alternatingly one low-doped and one highly-doped p-conductive layer is then applied. Subsequently, the layer sequence is etched anisotropically in such a way that an opening is formed which extends at least as far as the p$^+$ layer of the base layer. At least in a peripheral region of the opening, a p$^+$-conductive zone is subsequently produced, which joins the layer sequence. Next, the low-doped p-conductive layers of the layer sequence are etched selectively to the p$^+$ layers, the dielectric is deposited, and a counterelectrode is formed.

In accordance with another mode of the invention, the base layer is produced in such a way that it contains only one p$^+$ layer, or one p$^+$ layer with an underlying layer of oxide and/or nitride.

In accordance with a further mode of the invention, depending on the desired structure of the capacitor, the p$^+$ zone in the opening is produced by oblique implantation of ions, that is boron ions, or by applying a p$^+$-conductive material. The important factor in this case is that the layer sequence not be covered completely by a p$^+$ zone, to allow the etchant to attack the low-doped p– material in the ensuing selective etching.

In accordance with an added mode of the invention, the selective etching is carried out with the aid of an alkaline etchant, for instance an ethylene diamine pyrocatechol solution or a potassium hydroxide solution.

In accordance with an additional mode of the invention, after the low-doped p-conductive layer materials are etched out, a dielectric is applied, for instance an ONO dielectric, and then a conductive material is conformally deposited as a counterelectrode.

In accordance with yet another mode of the invention, the base layer is produced on a planarized surface of an insulator. If a contact hole to an underlying terminal surface is provided in the insulator, then this contact hole can likewise be filled up with the p$^+$ material of the base layer. In addition to this vertical contacting of the electrode structure, contacting through lateral terminals is also possible. The base layer and subsequently the electrode structure can on the other hand be produced in a trench of an isolation layer or a silicon layer. Optionally, a silicon oxide and/or a silicon nitride layer is provided underneath the p$^+$ partial layer of the base layer.

The production of the capacitor is based on the knowledge that the etching rate of p$^+$-doped silicon is extremely low as compared with low-doped silicon in alkaline etching solutions. In a publication by H. Seidel et al, entitled: Anisotropic Etching of Crystalline Silicon in Alkaline Solutions, J. Electrochem. Soc., Vol. 137, No. 11, November 1990, pp. 3626–3632, the etching rate of p-doped silicon in an ethylene diamine pyrocatechol solution is constant down to a concentration of $10^{19}$ cm$^{-3}$, and then drops off sharply. At a concentration of $2 \cdot 10^{20}$ cm$^{-3}$, the etching rate is then only less than $\frac{1}{1000}$ the etching rate at $10^{19}$ cm$^{-3}$.

Other features which are considered as characteristic for the invention are set forth in the appended claims.

Although the invention is illustrated and described herein as embodied in a capacitor in a semiconductor configuration and a process for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
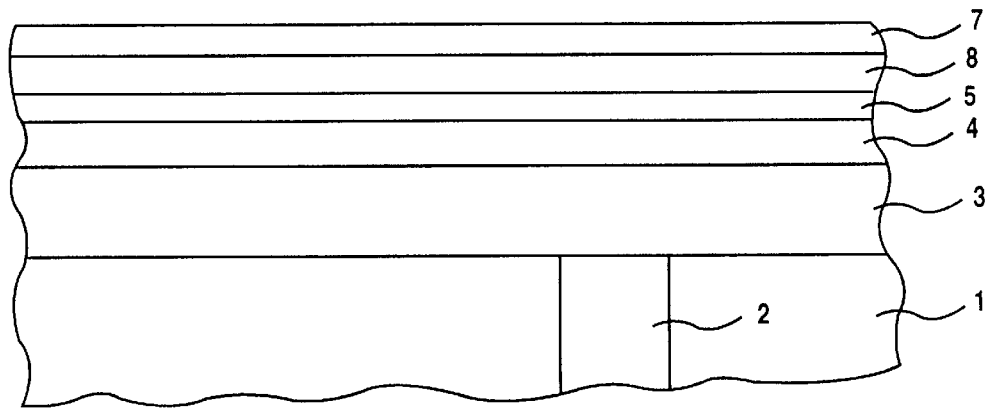
FIGS. 1a–1f are fragmentary, diagrammatic, cross-sectional views illustrating a production of a first exemplary embodiment of a capacitor.

Referring now to the figures of the drawings in detail and first, particularly, to FIG. 1a thereof, there is seen a substrate configuration that has an insulating layer 1 on its surface. Other elements of a semiconductor configuration, such as transistors, may be disposed underneath the insulating layer. Within the insulating layer 1, a contact hole 2 is provided, flush with the surface, and the hole is filled with a metallizing material. Tungsten, tantalum, titanium, titanium nitride, or doped polysilicon may be provided as the filling material. In the case of n-doped polysilicon, it is necessary to silicize this material, so that a metal intermediate layer appears at the surface. The contact hole 2, filled with a material with metallic conductivity, forms a terminal contact for the electrode structure to be produced. A glass layer, such as BPSG, may be provided as the insulating layer 1 of the substrate configuration. It has the advantage of a plane surface from liquefication of the glass. However, it is also possible to provide an insulating layer that is planarized through the use of a polishing step, such as CMP.

Next, over the surface of the substrate configuration and the contact hole 2, a base layer 3 is produced, which in the exemplary embodiment is a highly-doped p-conductive layer. The magnitude of the doping depends on the choice of the etching solution to be used layer and should be selected in such a way that the etching rate is extraordinarily low. For instance, for an ethylene diamine pyrocatechol solution, it is expedient to choose a boron concentration $>10^{20}$ cm$^{-3}$. The thickness of the base layer may be 300 nm, for instance. Next, over the highly-doped p-conductive layer of the base layer 3, a layer sequence is applied including alternatingly one p– and one p$^+$ layer. The highly doped layers 5 and 7 are doped in the same way as the highly-doped p-conductive layer of the base layer. The low-doped p-conductive layers 4 and 6 have doping that enables a high etching rate with respect to the selectively acting etchant. For instance, the boron dopant in the ethylene diamine pyrocatechol solution described first above is approximately $10^{19}$ cm$^{-3}$ or less.

The layer thicknesses are chosen in such a way that the low-doped p-conductive layers are thicker than the highly-doped p-conductive layers. For instance, the p– layers are 30 nm thick, and the p$^+$ layers 5 and 7 are 10 nm thick.

The layers 3–7 are conformally deposited. Examples of possible deposition methods are low-pressure chemical vapor deposition, particularly hot-wall or cold-wall LPCVD, or molecular beam epitaxy. The layer sequence may be applied in situ in one and the same reactor. This requires setting different process parameters for the p–-doped layers 4 and 6 and the p$^+$-doped polysilicon layers 3, 5 and 7, respectively.

Figure 1B:
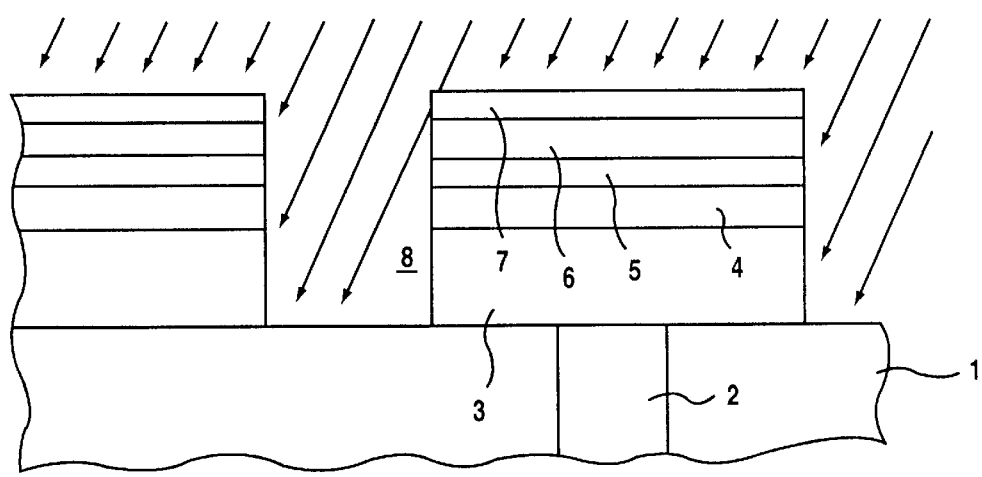
Figure 3A:
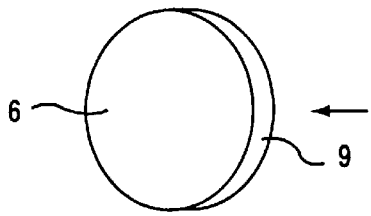
FIGS. 3a and 3b are plan views of possible geometrical configurations.
Figure 3B:
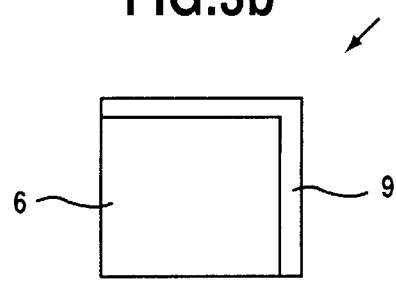

Next, in accordance with FIG. 1b, a non-illustrated mask is produced with the aid of which the layer sequence 3–7 is etched anisotropically, forming one or more openings 8. KOH is one possible etchant. In the drawing, the openings 8 are etched through to the insulating layer of the substrate configuration 1. This creates separate islands, in each of which one capacitor can be produced. However, it is not necessary in every case to etch the openings as far as the p$^+$-conductive layer of the base layer. If the base layer 3 is not etched all the way through, a large-area capacitor configuration is created. The structuring of the polysilicon layer sequence is carried out in such a way that the stacks are round or polygonal in plan view, as seen in FIGS. 3a and 3b.

In the next step, a highly-doped p-conductive zone is created in a peripheral region of the opening 8 and joins the layer sequence 3–7. To that end, an oblique implantation of BF$_2$ ions is carried out, for instance at an angle of 8° from the vertical. Alternatively, it is also possible to implant the other side of the opening shown in FIG. 1b with boron ions.

The effect of the implantation is that the peripheral region of the opening that lies under the bombardment of the boron ions has a limited highly doped zone located in the low-doped p-conductive layers 4 and 6. This high doping is equivalent to the doping of the remaining p$^+$ polysilicon layers. Next, a temperature step is provided, in order to assure that the implanted boron ions will be activated, or in other words will occupy the corresponding spaces in the lattice of the polysilicon layer 4 and 6. This requires that no diffusion from the highly doped zones into the low-doped zones occur. The temperature step can preferably be carried out with the aid of an RTA (rapid thermal annealing) process. The selected temperature is approximately 850 to 900° C.

Figure 1C:
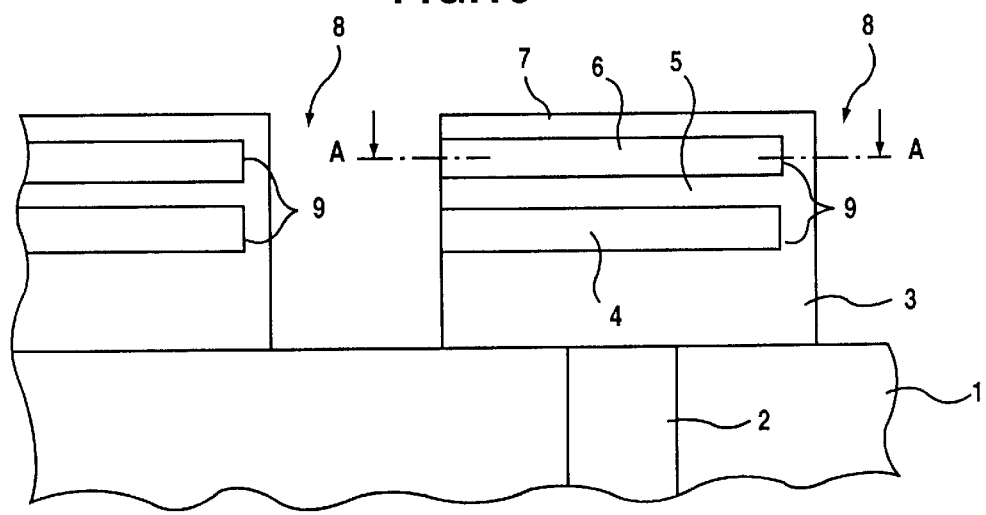

FIG. 1c shows the structure that has arisen after the temperature step. The oblique implantation of boron ions into the openings 8 has created a p$^+$ zone 9 in the peripheral region of each opening. This zone joins together the p$^+$ layers 3, 5 and 7. In the exemplary embodiment, the p$^+$ zones take the form of a letter "E" pointing to the left. Conversely, on the peripheral region of the openings 8 that faces the zones 9, the originally created layer sequences 3–7 are obtained, so that the low-doped layers 4 and 6 point freely toward the opening.

If the anisotropic etching step with which the openings 8 are made has created a structured layer sequence that is round in plan view, then the zones 9 extend with decreasing thickness over a certain portion of the circumference of the stack. With a rectangular stack, it can be accomplished that only one side of the stack or two sides of the stack are peripherally p$^+$-doped. As a result, the zones 9 are present either on only one side of the stack or angularly cover two sides of the stack. The diameter of a stack shaped in this way, that is its width, is approximately 1 µm. FIGS. 3a and 3b show examples for the embodiment of the structured, doped stacks of FIG. 1c. In each case the direction with which the implantation has been carried out is indicated. In the examples shown in FIGS. 3a and 3b, a very stable structure for the capacitor to be produced is attained.

Figure 1D:
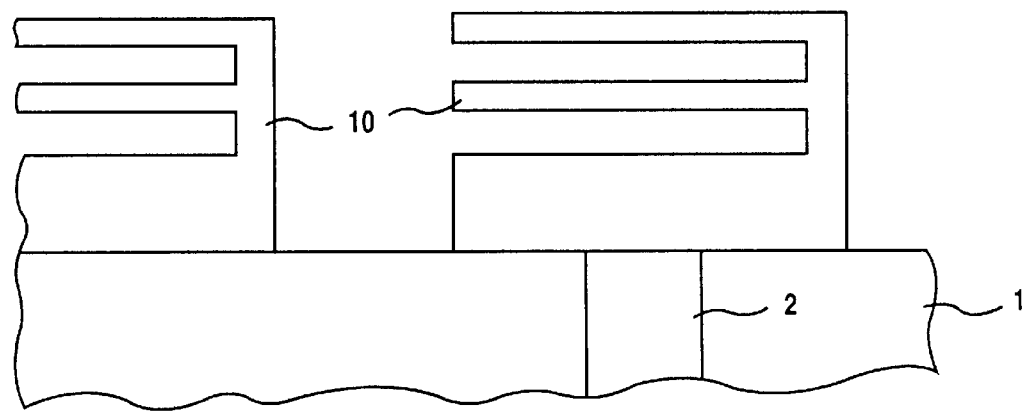

In the next step, the configuration is selectively etched isotropically with an alkaline etchant. Ethylene diamine pyrocatechol is, for instance, possible as the etching solution. At the selected doping, the alkaline etching solutions have the property that the low-doped p-conductive layers are etched more strongly than the p$^+$-doped layers, with a selectivity of 100:1 to 1000:1. The result after the etching operation is a structure of FIG. 1d, in which only the p$^+$-doped regions then remain, joined together in such a way that a support structure is the result. This structure is marked with reference numeral 10.

Figure 1E:
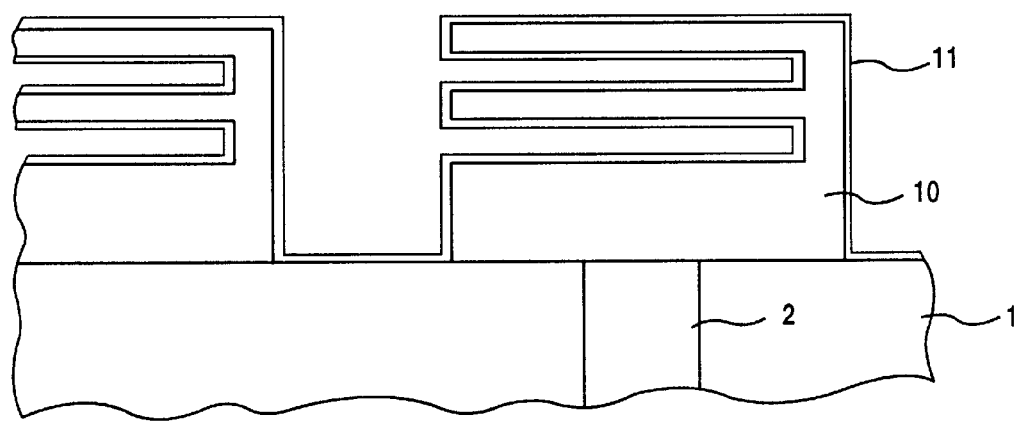
Figure 1F:
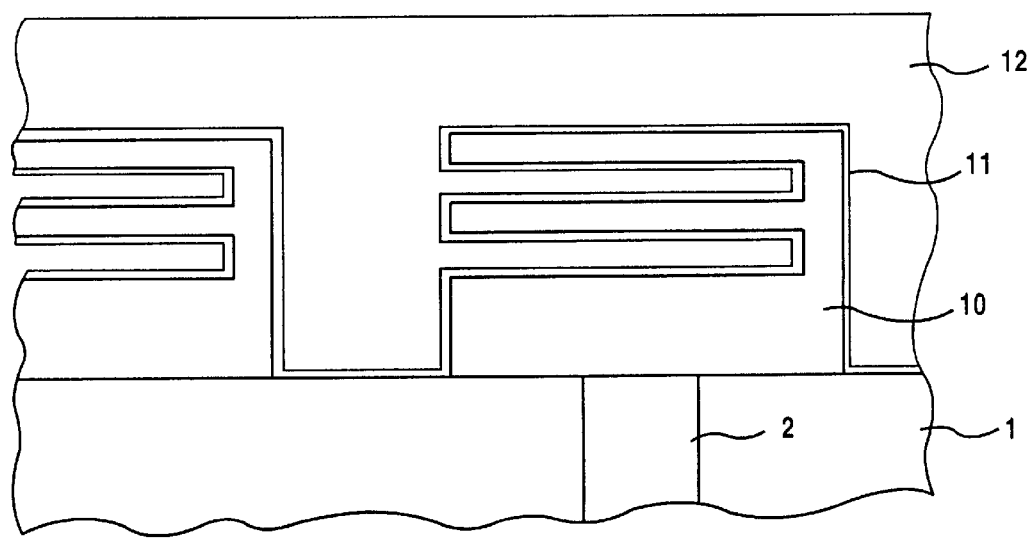

With the next step, in accordance with FIG. 1e, the capacitor dielectric is conformally deposited. The dielectric may be formed of silicon oxide and/or silicon nitride. Preferably, an ONO dielectric layer is provided, which includes a first silicon oxide layer, a silicon nitride layer, and a second silicon oxide layer. The overall layer thickness of the capacitor dielectric is intended to be approximately 10 nm. However, the chosen thickness of the capacitor dielectric may be less, for instance 3 nm for higher capacitances to be produced.

A counterelectrode 12 of the capacitor is produced, for instance, in the form of p$^+$-doped polysilicon, over a capacitor dielectric 11, by conformal deposition. The same methods that have already been used to produce the layer sequence can be considered for this deposition method.

The counterelectrode 12 can be optionally structured and contacted with typical methods in semiconductor technology.

Figure 2:
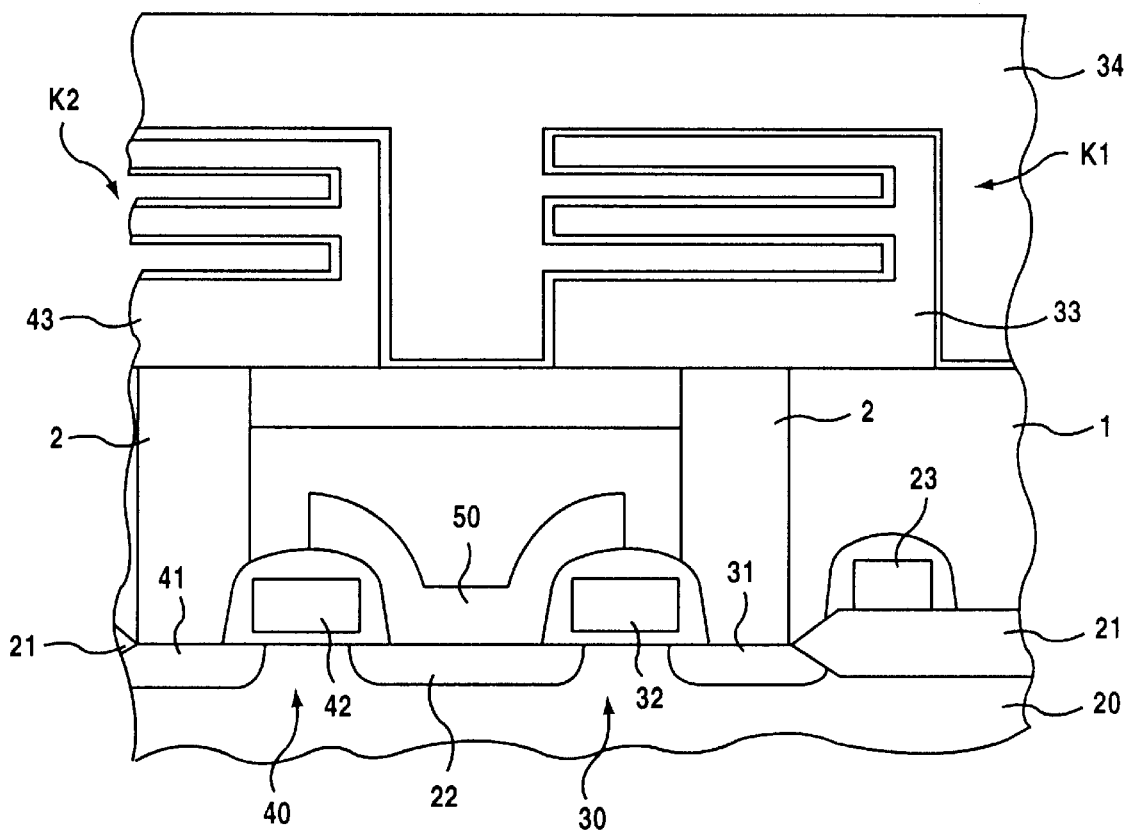
FIG. 2 is a fragmentary, cross-sectional view of a second exemplary embodiment of a capacitor.

FIG. 2 shows a second exemplary embodiment of the capacitor, in which the capacitor is intended as a memory capacitor in a DRAM semiconductor configuration. A substrate configuration beneath the insulating layer 1 includes the selection transistors of the memory capacity. Isolated regions are formed in a substrate 20 with the aid of field oxide zones 21. An isolated region includes two selection transistors 30 and 40, respectively, which have one common source zone 22. Extending on both sides of the source zone 22 is a channel region, which is controlled by a gate 32 and 42, respectively, as a word line, that is isolated on all sides in cross section. Toward the field oxide 21, the transistors each have respective drain zones 31 and 41. Each drain of a memory cell, which is formed by one selection transistor and one capacitor, is joined to the electrode structure of a capacitor through a contact hole in the insulating layer. For instance, the drain 31 of the transistor 30 is connected to an electrode 33 of a first capacitor K1, and the drain 41 of the transistor 40 is connected to an electrode 43 of a second capacitor K2. The electrode structure 33 and 43, in contrast to the exemplary embodiment of FIG. 1, is produced in such a way that in the substrate layer 1, the contact holes 2 are first produced in the form of self-adjusted overlapping contacts to the drain zones of the respective transistor, and after that the $p^+$-doped base layer is produced by conformal deposition, with which the contact hole is filled. In the exemplary embodiment of FIG. 2, the source and drain zones 22, 31 and 41 are provided as $p^+$-doped zones, corresponding to p-channel selection transistors. In n-channel selection transistors, the contact hole 2 must have an intermediate layer with a metallically conductive material, such as tungsten, tantalum, titanium, titanium nitride, or a silicide. Word lines 23 for the next memory cells are disposed above the field oxide region 21. The word lines 23, 32 and 42 preferably include highly doped polysilicon or polycide. With the aid of a self-adjusted overlapping contact, the source zone 22 is made to contact a bit line 50, which is made of tungsten or polycide. In the aforementioned memory configuration of FIG. 2, all of the capacitors have one common counterelectrode 34, the so-called cell plate.

Figure 4A:
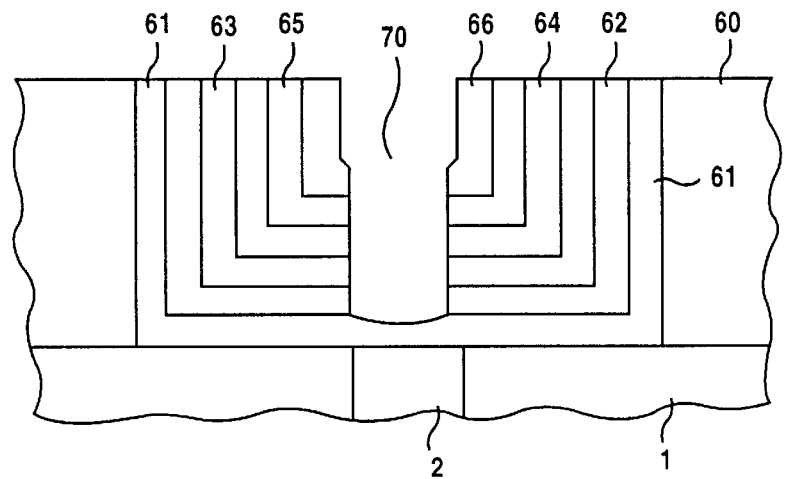
FIGS. 4a–4c are fragmentary, cross-sectional views illustrating a production through a third exemplary embodiment of a capacitor.
Figure 4B:
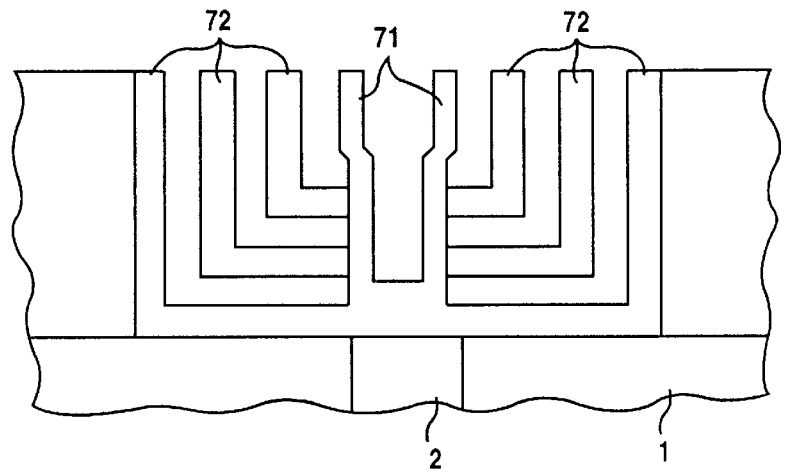

FIG. 4 shows a further exemplary embodiment of the capacitor, which in this case is constructed as a cup-shaped configuration. First, an insulator layer 60 is formed on a substrate 1 with a contact hole 2 that is filled, for instance, with metal. The insulator layer 60 is then structured, creating an opening down to the substrate layer 1 or the filled contact hole 2. By conformal deposition, a base layer 61 of highly-doped p-conductive polysilicon is formed in the manner already described, and then over that a layer sequence is applied, which alternatingly includes a low-doped and a highly-doped p-conductive layer. The low-doped layers are designated by reference numerals 62, 64 and 66 and the highly-doped layers by reference numerals 63 and 65. The result initially is a structure in which the layers 61–66 rest in one another in cup-like fashion and in which the layers applied later in the group are smaller at the bottom and on the periphery than the layers applied first. Through the use of a mask technique and an ensuing anisotropic etching step, an opening 70 is created centrally in the layer sequence, reaching as far as the base layer 61. As a result, the layer sequence is laid bare in the bottom region, as is seen in FIG. 4a.

Next, the opening 70 is at least partially filled with a highly-doped p-conductive material. This can be carried out as for the layers 63 and 65. If there is a sufficiently large opening in comparison with the edge height of the layers, an oblique implantation can alternatively be selected. As an alternative to creating an opening and filling the opening with $p^+$ material, it is possible through the use of a mask and one or more successive implantation steps to dope the region, defined by the mask opening, on the bottom of the layer sequence with $p^+$ atoms. Preferably, a plurality of implantation steps are provided in such a way that the maximum doping in each case is located in a p– layer region. This creates a $p^+$ support, defined by the mask opening, in the bottom region.

The $p^+$-doped zones have a dopant concentration of at least $10^{20}$ cm$^{-3}$, while the low-doped p– zones 62, 64 and 66 have a dopant concentration of at most $10^{19}$ cm$^{-3}$. A temperature step may be appended, for instance an RTA step, so that no diffusion from the $p^+$-doped layers can occur. Next, the structure is etched selectively, isotropically, in an alkaline etching solution. In this process the $p^+$-doped layers remain, while the p–-doped layers are etched out. The selectivity of the etching process is sufficiently high to produce a support structure as in FIG. 4b, which looks something like a candelabrum. In contrast to the exemplary embodiment of FIG. 1, the central highly-doped p– conductive zone 70 is produced in such a way that the opening 70 in the bottom region of the layer sequence is filled completely. The deposition is carried out conformally by the deposition methods already mentioned, followed by structuring. A zone 71 therefore joins together the layer sequence 72, shown in FIG. 4b, in the bottom region of the layer sequence.

Figure 4C:
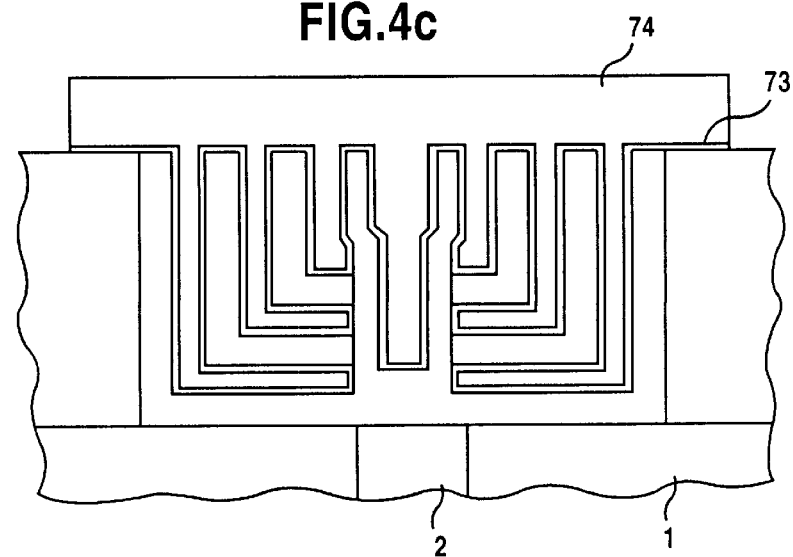

Next, as in FIG. 4c, a dielectric 73, for instance in the form of an ONO dielectric, and a counterelectrode 74, for instance of $p^+$-doped polysilicon, are created by conformal deposition. The dielectric and the counterelectrode 74 can subsequently be structured.

It is possible, as in FIG. 2, to deposit the base layer in the contact hole 2 as well by conformal deposition, if desired. It is also possible to place a capacitor of the type shown in FIG. 4 in a silicon substrate and to join the electrode structure at the edge of the trench to a semiconductor configuration, for instance a selection transistor of a DRAM configuration. In this case, the counterelectrode 74 may be constructed as a continuous cell plate, as in known trench capacitors. If the capacitor in a silicon substrate is disposed as a trench capacitor, it suffices, for a p-substrate, to produce the base zone through the use of higher doping of the trench region. In an n-doped substrate, the highly-doped p-conductive layer of the base layer 61 is isolated from the substrate by an insulating layer. Such a layer may be formed of silicon oxide and/or silicon nitride.

We claim:

1. A process for producing a capacitor on a semiconductor substrate, which comprises:

produce a base layer including a highly-doped p-conductive layer, on a surface of a substrate;

applying at least one alternating layer sequence of one low-doped and one highly-doped p-conductive layer, on a surface of the highly-doped p-conductive layer of the base layer;

structuring the layer sequence by an anisotropic etching, forming at least one opening extending as far as the base layer;

producing a highly-doped p-conductive zone joining the layer sequence, at least in a peripheral region of the opening;

selectively etching the low-doped p-conductive layers of the layer sequence to the highly-doped p-conductive layer sequence;

conformally depositing a capacitor dielectric; and conformally depositing a conductive layer over the capacitor dielectric.

2. The process according to claim 1, which comprises producing the base layer by a highly-doped p-conductive layer being produced by doping of a semiconductor zone.

3. The process according to claim 1, which comprises producing the base layer by a highly-doped p-conductive layer being produced by deposition of a doped semiconductor material.

4. The process according to claim 2, which comprises producing the base layer by at least one of an oxide layer and a nitride layer applied prior to the highly-doped p-conductive layer.

5. The process according to claim 3, which comprises producing the base layer by at least one of an oxide layer and a nitride layer applied prior to the highly-doped p-conductive layer.

6. The process according to claim 1, which comprises applying the base layer to a planarized surface of a substrate layer.

7. The process according to claim 1, which comprises forming the highly-doped p-conductive zone in the at least one opening by oblique implantation of ions into the layer sequence of low-doped and highly-doped p-conductive layers.

8. The process according to claim 7, which comprises implanting boron fluoride ions.

9. The process according to claim 1, which comprises producing the highly-doped p-conductive layer zone in the at least one opening by application of a highly-doped p-conductive material.

10. The process according to claim 1, which comprises performing a temperature step after the highly-doped p-conductive zone is produced.

11. The process according to claim 1, which comprises carrying out the selective etching step isotropically by an alkaline etchant.

12. The process according to claim 1, which comprises carrying out the etching step with an ethylene diamine pyrocatechol solution as an etchant.

13. The process according to claim 1, which comprises carrying out the etching step with a potassium hydroxide solution as an etchant.

14. The process according to claim 1, which comprises conformally depositing at least one of silicon oxide and silicon nitride as the capacitor dielectric.

15. The process according to claim 1, which comprises applying the layer sequence in stacked fashion.

16. The process according to claim 1, which comprises applying the layer sequence side by side.

17. The process according to claim 1, which comprises interesting the layer sequence in cup-like fashion.

18. The process according to claim 1, which comprises producing the counterelectrode of highly-doped p-conductive material on the capacitor dielectric.

19. The process according to claim 1, which comprises placing the conducting structure on at least one edge of the elements and extending the conducting structure crosswise to the surface of the elements.

20. A process for producing a capacitor on a semiconductor substrate, which comprises:

producing a base layer including a highly-doped p-conductive layer, on a surface of a substrate;

applying at least one alternating layer sequence of one low-doped and one highly-doped p-conductive layer, on a surface of the highly-doped p-conductive layer of the base layer;

structuring the layer sequence by an anisotropic etching, forming at least one opening extending as far as the base layer;

producing a highly-doped p-conductive zone directly joining the layer sequence, at least in a peripheral region of the opening;

selectively etching the low-doped p-conductive layers of the layer sequence to the highly-doped p-conductive layer sequence;

conformally depositing a capacitor dielectric; and conformally depositing a conductive layer over the capacitor dielectric.

21. A process for producing a capacitor on a semiconductor substrate, which comprises:

producing a base layer including a highly-doped p-conductive layer, on a surface of a substrate;

subsequently, applying at least one alternating layer sequence of one low-doped and one highly-doped p-conductive layer, on a surface of the highly-doped p-conductive layer of the base layer;

subsequently, structuring the layer sequence by an anisotropic etching, forming at least one opening extending as far as the base layer;

subsequently, producing a highly-doped p-conductive zone joining the layer sequence, at least in a peripheral region of the opening;

subsequently, selectively etching the low-doped p-conductive layers of the layer sequence to the highly-doped p-conductive layer sequence;

subsequently, conformally depositing a capacitor dielectric; and subsequently, conformally depositing a conductive layer over the capacitor dielectric.

* * * * *